United States Patent
Lee et al.

(10) Patent No.: US 10,423,042 B2
(45) Date of Patent: Sep. 24, 2019

(54) LIQUID CRYSTAL DISPLAY DEVICE AND MANUFACTURING METHOD THEREOF

(71) Applicant: Samsung Display Co. Ltd., Yongin (KR)

(72) Inventors: Joo Hyung Lee, Seongnam-si (KR); Shin Il Choi, Hwaseong-si (KR); Kyeong Su Ko, Hwaseong-si (KR); Dong Il Kim, Suwon-si (KR); Jong Mo Yeo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/228,549

(22) Filed: Aug. 4, 2016

(65) Prior Publication Data

US 2017/0038623 A1    Feb. 9, 2017

(30) Foreign Application Priority Data

Aug. 4, 2015    (KR) .......................... 10-2015-0109933

(51) Int. Cl.
*G02F 1/1368* (2006.01)
*H01L 29/417* (2006.01)
(Continued)

(52) U.S. Cl.
CPC ...... *G02F 1/1368* (2013.01); *H01L 21/32139* (2013.01); *H01L 27/124* (2013.01); *H01L 27/1222* (2013.01); *H01L 29/41733* (2013.01)

(58) Field of Classification Search
CPC ............. G02F 1/1368; G02F 1/134363; H01L 29/41733; H01L 27/1214; H01L 21/32139;
(Continued)

(56) References Cited

U.S. PATENT DOCUMENTS

| 2001/0040646 A1* | 11/2001 | Hannuki ........... G02F 1/134363 349/43 |
| 2010/0244034 A1* | 9/2010 | Miyairi ............. H01L 21/67207 257/59 |
| 2015/0053970 A1* | 2/2015 | Lee ..................... H01L 27/1225 257/43 |

FOREIGN PATENT DOCUMENTS

| JP | 2003140189 | 5/2003 |
| KR | 100500684 | 7/2005 |

(Continued)

*Primary Examiner* — Mouloucoulaye Inoussa
(74) *Attorney, Agent, or Firm* — Cantor Colburn LLP

(57) ABSTRACT

A liquid crystal display device includes a substrate; a gate electrode on the substrate; a semiconductor pattern layer on the gate electrode; and source and drain electrodes on the semiconductor pattern layer and spaced apart from each other. The source electrode includes: a first facing portion facing the drain electrode; and a first protrusion protruding toward the drain electrode from the first protrusion. The drain electrode includes: a second facing portion facing the source electrode; and a second protrusion protruding toward the source electrode from the second facing portion and facing the first protrusion. The semiconductor pattern layer includes: a source area overlapping the source electrode; a drain area overlapping the drain electrode; and a bridge area connecting the source area with the drain area, and a space defined between the first protrusion and the second protrusion is on the bridge area.

20 Claims, 14 Drawing Sheets

(51) Int. Cl.
*H01L 21/3213* (2006.01)
*H01L 27/12* (2006.01)

(58) Field of Classification Search
CPC .................. H01L 21/308; H01L 27/127; H01L 29/78696; H01L 29/458; H01L 29/4908; H01L 29/66765; H01L 29/78678; H01L 27/1288
USPC .................... 349/43, 139; 438/158, E21.409
See application file for complete search history.

(56) References Cited

FOREIGN PATENT DOCUMENTS

| KR | 100683155 | 2/2007 |
| KR | 1020110125399 | 11/2011 |
| KR | 1020140098894 | 8/2014 |

\* cited by examiner

LIQUID CRYSTAL DISPLAY DEVICE AND MANUFACTURING METHOD THEREOF

This application claims priority to Korean Patent Application No. 10-2015-0109933 filed on Aug. 4, 2015, and all the benefits accruing therefrom under 35 U.S.C. § 119, the content of which is incorporated herein by reference in its entirety.

BACKGROUND

1. Field

Embodiments of the invention relate to a liquid crystal display device and a method of manufacturing the liquid crystal display device.

2. Description of the Related Art

Along with the development of multimedia, importance of the display device has increased. In response to this, various types of display devices, such as a liquid crystal display, an organic light emitting display, are being used.

Among them, the liquid crystal display device is one of the most widely used type of flat panel display device, and the liquid crystal display device typically includes two substrates in which field generating electrodes such as a pixel electrode and a common electrode are disposed, and a liquid crystal layer interposed therebetween. The liquid crystal display device generates an electric field in the liquid crystal layer by applying a voltage to the field generating electrodes, and displays an image by determining the direction of the liquid crystal molecules of the liquid crystal layer and by controlling the polarization of incident light.

Meanwhile, as the resolution or the like of the liquid crystal display device increases, a high performance thin film transistor ("TFT") is desired. However, the TFT has a large dimension and thus occupies a large area of the substrate, such as a glass.

SUMMARY

An embodiment of the invention provides a liquid crystal display device which includes a thin film transistor having a proper channel length.

Another embodiment of the invention provides a method of manufacturing a liquid crystal display device with reduced time and reduced cost by simplifying processes thereof.

According to embodiments of the invention, characteristics of the thin film transistor are improved by ensuring a proper channel length in the liquid crystal display device. In such embodiments, time and cost for the manufacturing process is reduced by simplifying the process of the liquid crystal display device.

According to an embodiment of the invention a liquid crystal display device includes a substrate, a gate electrode disposed on the substrate, a semiconductor pattern layer disposed on the gate electrode, a source electrode disposed on the semiconductor pattern layer, and a drain electrode disposed on the semiconductor pattern layer and spaced apart from the source electrode. In such an embodiment, the source electrode includes: a first facing portion which faces the drain electrode; and a first protrusion which protrudes toward the drain electrode from the first protrusion. In such an embodiment, the drain electrode includes: a second facing portion which faces the source electrode; and a second protrusion which protrudes toward the source electrode from the second facing portion and faces the first protrusion. In such an embodiment, the semiconductor pattern layer includes: a source area overlapping the source electrode; a drain area overlapping the drain electrode; and a bridge area which connects the source area with the drain area, and a space defined between the first protrusion and the second protrusion is disposed on the bridge area. According to another embodiment of the invention, a method of manufacturing the liquid crystal display includes preparing a substrate on which the first conductive film, the gate insulating film, the semiconductor layer, the ohmic contact layer and the second conductive film are sequentially disposed one on another; providing a photosensitive film pattern on the substrate, where the photosensitive film pattern includes a first area, a second area facing the first area, and a third area connecting the first area with the second area; providing a source electrode below the first area, a drain electrode below the second area, and a channel section below the third area, by etching the second conductive film and the ohmic contact layer using the photosensitive film pattern as an etching mask; and providing a semiconductor pattern layer by etching the semiconductor layer using the photosensitive film pattern as an etching mask, where the semiconductor pattern layer includes a source area disposed below the first area and overlapping the source electrode, a drain area disposed below the second area and overlapping the drain electrode, and a bridge area disposed below the third area and connecting the source area and the drain area.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
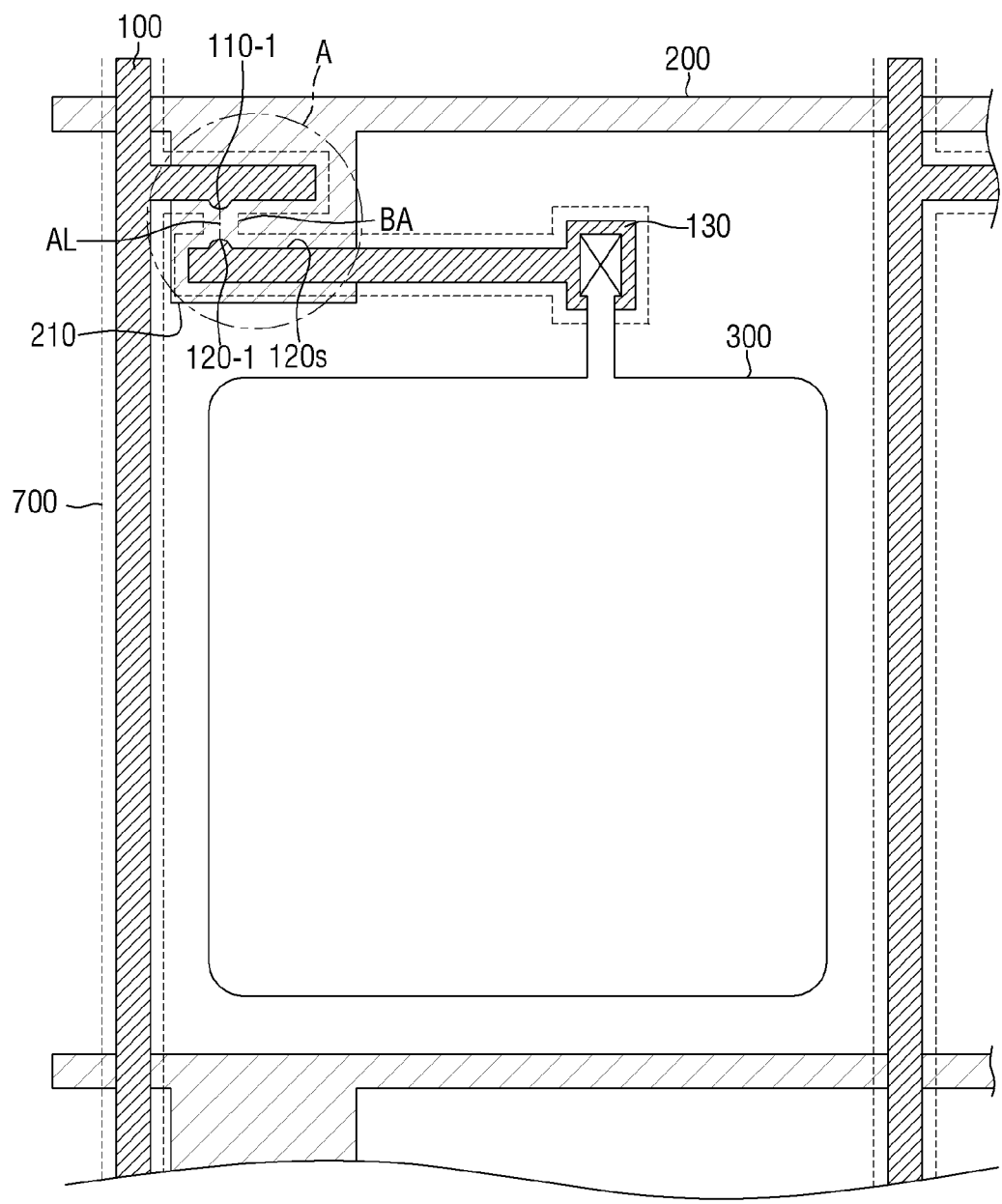
FIG. 1 is a partial plan view of a liquid crystal display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
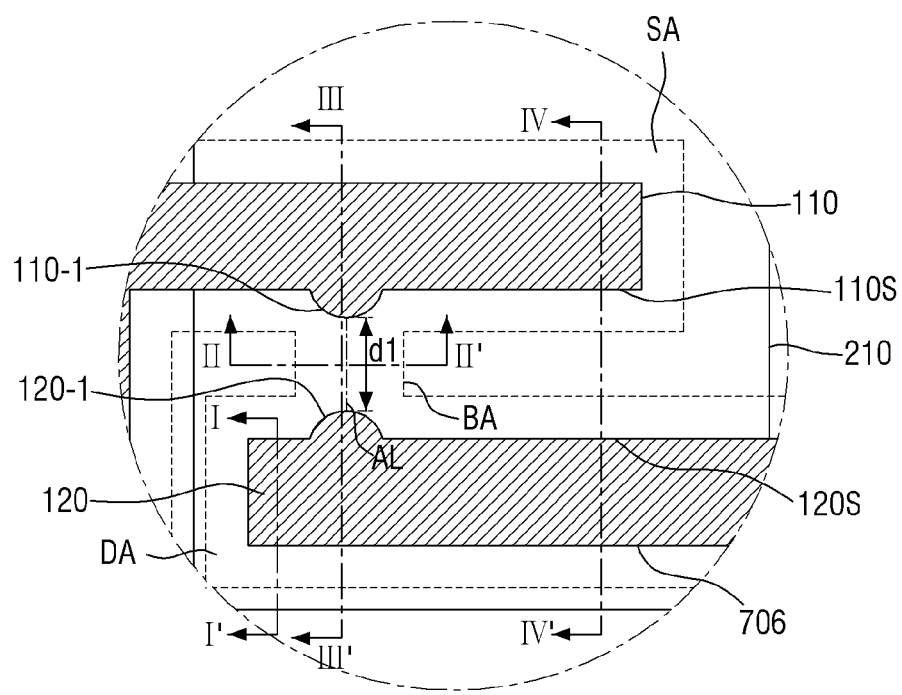
FIG. 2 is a partially enlarged cross-sectional view of a part 'A' of FIG. 1.
Figure 3:
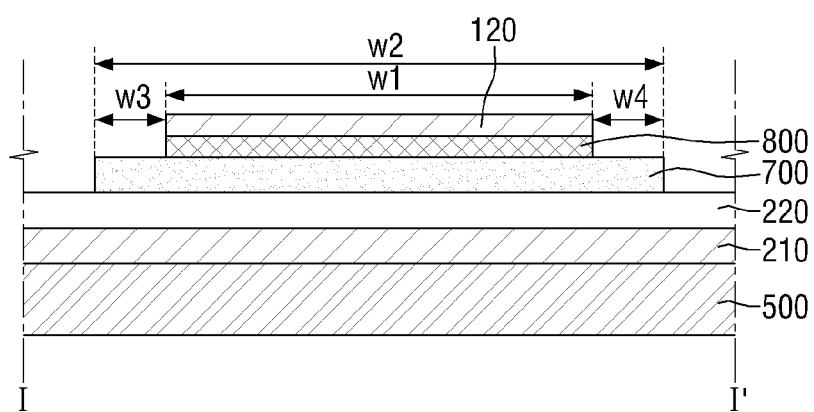
FIG. 3 is a cross-sectional view taken along line I-I' in FIG. 2.
Figure 4:
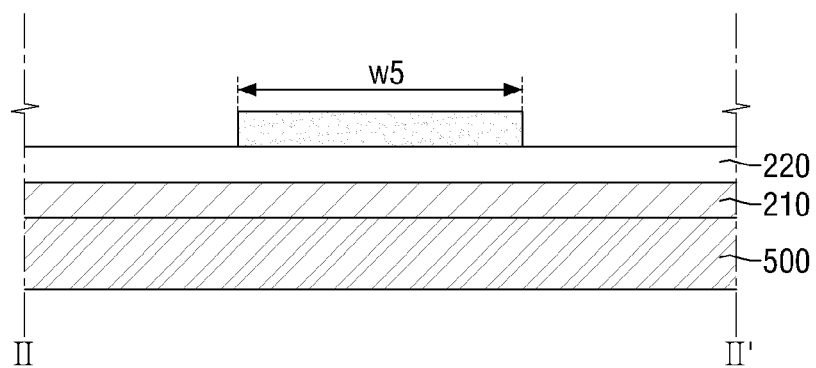
FIG. 4 is a cross-sectional view taken along line II-II' in FIG. 2.
Figure 5:
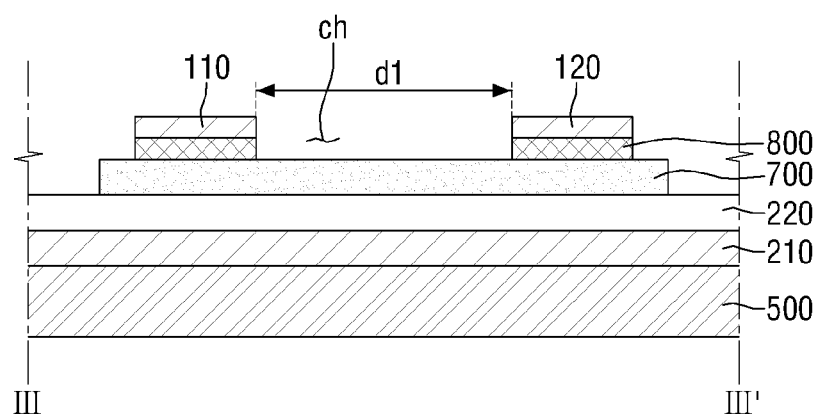
FIG. 5 is a cross-sectional view taken along line III-III' in FIG. 2.
Figure 6:
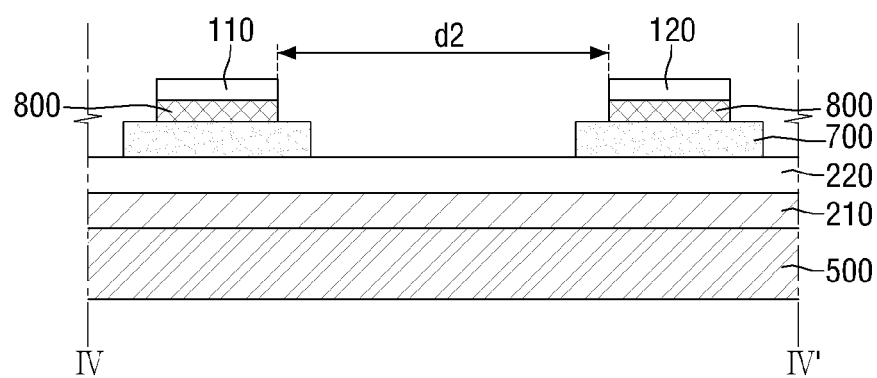
FIG. 6 is a cross-sectional view taken along line IV-IV' in FIG. 2.

FIG. 1 is a plan view of a liquid crystal display device according to an embodiment of the invention. FIG. 2 is a partially enlarged cross-sectional view of a part 'A' of FIG. 1. FIG. 3 is a cross-sectional view taken along line I-I' in FIG. 2. FIG. 4 is a cross-sectional view taken along line II-II' in FIG. 2. FIG. 5 is a cross-sectional view taken along line III-III' in FIG. 2. FIG. 6 is a cross-sectional view taken along line IV-IV' in FIG. 2.

Referring to FIGS. 1 and 2, an embodiment of the liquid crystal display device includes a substrate 500, a gate electrode 210 disposed on the substrate 500, a semiconductor pattern layer 700 disposed on the gate electrode 210, a source electrode 110 disposed on the semiconductor pattern layer 700, and a drain electrode 120 disposed on the semiconductor pattern layer 700 and spaced apart from the source electrode 110. The source electrode 110 includes a first facing portion 110S facing the drain electrode 120, and a first protrusion 110-1 protruding toward the drain electrode 120 from the first facing portion 110S. The drain electrode 120 includes a second facing portion 120S facing the source electrode 110, and a second protrusion 120-1 which protrudes toward the source electrode 110 from the second facing portion 120S to face the first protrusion 110-1. The semiconductor pattern layer 700 includes a source area SA on which the source electrode 110 is superimposed, a drain area DA on which the drain electrode 120 is superimposed, and a bridge area BA which is between the source area SA and the drain area DA, and connects the source area SA with the drain area DA.

The substrate 500 may include or be formed of a material having heat resistance and translucency. The substrate 500, for example, may be formed of transparent glass or plastic, but it is not limited thereto.

Gate wires 200, 210 may be disposed on the substrate 500. The gate wires 200, 210 may include a plurality of gate lines 200 which transmits gate signals, gate electrodes 210 protruding from the gate lines 200 in the form of protrusions 200, and a gate distal end (not illustrated) disposed in at least one end of the gate line 200.

The gate line 200 may extend in a first direction. The first direction may be a horizontal direction as illustrated in FIG. 1, but the first direction is not limited thereto. The gate electrode 210 may constitute three terminals of the thin film transistor, together with a source electrode 110 and a drain electrode 120 to be described later.

The gate wires 200, 210 may include at least one selected from aluminum (AL)-based metal including an aluminum alloy, silver (Ag)-based metal including a silver alloy, copper (Cu)-based metal including a copper alloy, molybdenum (Mo)-based metal including a molybdenum alloy, chromium (Cr), titanium (Ti) and tantalum (Ta), for example, but the materials of the gate wires 200, 210 are not limited thereto. Alternatively, metallic or polymeric materials having performance required to achieve a desired display device may be used as a material of the gate wires 200, 210.

The gate wires 200, 210 may have a single-film structure, but not being limited thereto. Alternatively, the gate wires 200, 210 may be a double film, a triple film or multi-films without being limited thereto.

A gate insulating film 220 may be disposed on the gate wires 200, 210. The gate insulating film 220 covers the gate wires 200, 210 and may be disposed to cover substantially the entire surface of the substrate 500.

In an exemplary embodiment, the gate insulating film 220 may include at least one selected from an inorganic insulating material such as silicon oxide (SiOx) and silicon nitride (SiNx), benzocyclobutene ("BCB"), and an organic insulating material such as acryl-based material and a polyimide, for example, but the material of the gate insulating film 220 is not limited thereto.

A semiconductor pattern layer 700 may be disposed on the gate insulating film 220.

The semiconductor pattern layer 700 may include amorphous silicon or polycrystalline silicon, but it is not limited thereto. Alternatively, the semiconductor pattern layer 700 may include an oxide semiconductor.

The semiconductor pattern layer 700 may have various shapes such as an island form and a liner form. In an embodiment, where the semiconductor pattern layer 700 has a linear form, the semiconductor pattern layer 700 may be disposed below the data wires 100 and may extend to the top of the gate electrode 210.

In an exemplary embodiment, the semiconductor pattern layer 700 may be patterned at substantially the same shape as the data wires 100, 110, 120, 130 in the areas other than the channel section Ch. In such an embodiment, the semiconductor pattern layer 700 may be disposed to overlap the data wires 100, 110, 120, 130 in all areas other than the channel section Ch. The channel section Ch may be disposed between the source electrode 110 and the drain electrode 120 which face each other. Specifically, the channel section Ch may entirely or partially overlap the bridge area BA to be described later, but it is not limited thereto. The channel section Ch serves to electrically connect the source electrode 110 with the drain electrode 120, and a shape thereof is not limited to a specific shape.

In an exemplary embodiment, the data wires 100, 110, 120, 130 is superimposed on the semiconductor pattern layer 700 other than the channel section Ch, and the semiconductor pattern layer 700 may have a relatively wider width than the data wires 100, 110, 120, 130. In such an embodiment, as shown in FIG. 1, an outer wall of the semiconductor pattern layer 700 may be disposed on the relatively outer side than outer walls of the data wires 100, 110, 120, 130 other than the channel section Ch.

The semiconductor pattern layer 700 may include a source area SA on which the source electrode 110 is superimposed, a drain area DA on which the drain electrode 120 is superimposed, and a bridge area BA between the source area SA and the drain area D.

The source area SA may overlap all or a part of the source electrode 110. An area occupied by the source area SA may be substantially the same as or wider than the area of the source electrode 110. In one exemplary embodiment, for example, the area of the source area SA is larger than the area of the source electrode 100, and the source electrode 110 may be disposed inside the boundary of the source area SA.

The drain area DA may overlap a portion or an entire of the drain electrode 120. The area occupied by the drain area DA may be substantially the same or wider than the area of the drain electrode 120. In one exemplary embodiment, for example, the area of the drain area DA is larger than the area of the drain electrode 120, and the drain electrode 120 may be disposed inside the boundary of the drain area DA. It will hereinafter be described in greater detail referring to FIGS. 3 and 4.

Hereinafter, for convenience of description, only the drain area DA and the drain electrode 120 will be described in greater detail with reference to FIGS. 3 and 4, and such features to be described may also be similarly applied to the source area SA and the source electrode 110.

For convenience of explanation, terms such as a first width w1, a second width w2, a third width w3 and a fourth width w4 are defined.

The first width w1 is the width in a direction perpendicular to the extending direction of the drain electrode 120. Specifically, the first width w1 may be a vertical width as shown in FIG. 2. In such an embodiment, the first width w1 may be a width in a second direction parallel to the data line 100. The second width w2 is a width in a direction perpendicular to the extending direction of the drain area DA. Specifically, the second width w2 may be a vertical width in FIG. 2. In such an embodiment, the second width w2 may be a width in the second direction parallel to the data line 100. In an exemplary embodiment, the second width w2 may be greater than the first width w1. In such an embodiment, the outside of the drain electrode 120 may be disposed on the inside of the drain area DA.

In an exemplary embodiment, as illustrated in FIG. 5, an outer wall of the drain electrode 110 may be disposed on the inner side as compared to the outer wall of the semiconductor pattern layer 700.

The third width w3 and the fourth width w4 (FIG. 3) are distances between the outer wall of the drain electrode 120 and the outer wall of the semiconductor pattern layer 700. That is, the third width w3 is a distance between the outer wall on one side of the drain electrode 120 and the outer wall on the one side of the semiconductor pattern layer 700, and the fourth width w4 is a distance between the outer wall on the other side of the drain electrode 120 and the outer wall on the other side of the semiconductor pattern layer 700. In an exemplary embodiment, the third width w3 and the fourth width w4 may be substantially the same as each other.

Referring to FIG. 4, a fifth width w5 may be defined as a width in the first direction of the bridge area BA of the semiconductor pattern layer 700. In an exemplary embodiment, the fifth width w5 may be relatively smaller than a value obtained by adding the third width w3 and the fourth width w4. In such an embodiment, the lateral width of the bridge area BA in FIG. 2 may be smaller than a value obtained by subtracting the vertical width of the drain electrode 120 from the vertical width of the drain area DA in FIG. 2. The structure of such a shape may be provided by the method of manufacturing the liquid crystal display device according to an embodiment of the invention to be described later, but it is not limited thereto.

The bridge area BA may be disposed between the drain electrode DA and the source area SA. Herein, the bridge area BA may be an area which connects the drain electrode DA with the source area SA. In an exemplary embodiment, some or all of the bridge area BA may overlap the above-described channel section Ch. In such an embodiment, the channel section Ch and the bridge area BA may have substantially the same width and may completely overlap each other, but it is not necessarily limited to, the channel section Ch may overlap only a part of the bridge area BA.

In an exemplary embodiment in which the source area SA and the drain area DA face each other by being spaced apart, the bridge area BA may occupy a part or all of the space between the source area SA and the drain area DA.

An ohmic contact layer 800, which is doped with an n-type impurity at a high concentration, may be disposed on the semiconductor pattern layer 700. The ohmic contact layer 800 may overlap all or a part of the semiconductor pattern layer 700. FIG. 5 illustrates one exemplary embodiment where the ohmic contact layer 800 overlaps a part of the semiconductor pattern layer 700, but not being limited thereto. In an alternative exemplary embodiment, the ohmic contact layer 800 may entirely cover the semiconductor pattern layer 700. In another alternative exemplary embodiment, the ohmic contact layer 800 may be omitted.

The ohmic contact layer 800 may overlap the source electrode 110 and the drain electrode 120 to be described later. The outer wall of the ohmic contact layer 800 may be aligned with the outer walls of the source electrode 110 and the drain electrode 120, but it is not limited thereto. Alternatively, the outer wall of the ohmic contact layer 800 may be disposed on the relatively outer side as compared to the outer walls of the source electrode 110 and the drain electrode 120.

The data wires 100, 110, 120, 130 may be disposed on the semiconductor pattern layer 700.

In an exemplary embodiment, as shown in FIG. 1, the data wires 100, 110, 120, 130 may include a data line 100 which extends in the second direction, e.g., in the vertical direction to intersect with the gate line 200, a source electrode 110 which branches from the data line 100 in the form of a branch and extends to the top of the semiconductor pattern layer 700, a drain electrode 120 which is spaced apart from the source electrode 110 and is disposed to face the source electrode 110 on the semiconductor pattern layer 700 around the gate electrode 210 or the channel section Ch, and a drain electrode extension section 130 which extends from the drain electrode 120 and is electrically connected to a pixel electrode 300 to be described later. The drain electrode extension section 130 has a relatively wider width than the drain electrode 120, which may further facilitate the electrical contact thereof with the pixel electrode 300.

The data wires 100, 110, 120, 130 will be described in greater detail referring to FIG. 2. The source electrode 110 may include a first facing portion 110S facing the drain electrode 120, and a first protrusion 110-1 protruding toward the drain electrode 120 from the first facing portion 110S. In an exemplary embodiment, as illustrated in FIG. 2, the outer circumference of the first protrusion 110-1 may have a convex parabolic shape toward the drain electrode 120, but it is not limited thereto. Alternatively, the outer circumference of the first protrusion 110-1 may include at least partially curved line or a polygonal shape.

The drain electrode 120 may include a second facing portion 120S that faces the source electrode 110, and a second protrusion 120-1 that protrudes from the second facing portion 120S. The second protrusion 120-1 may be disposed to face the first protrusion 110-1. In an exemplary embodiment, as illustrated in FIG. 2, the outer circumference of the second protrusions 120-1 may have a convex parabolic shape toward the source electrode 110, but it is not limited thereto. Alternatively, the outer circumference of the second protrusions 120-1 may include at least partially a curved line or a polygonal shape.

In an exemplary embodiment, the first protrusion 110-1 and the second protrusion 120-1 may have a symmetrical shape with each other with the bridge area BA interposed therebetween, but it is not limited thereto. Alternatively, the first protrusion 110-1 and the second protrusion 120-1 may have different shapes from each other.

The first protrusion 110-1 and the second protrusions 120-1 are disposed to be spaced apart from each other. In an exemplary embodiment, a constant or uniform space may be defined between the first protrusion 110-1 and the second protrusions 120-1. In an exemplary embodiment, the space between the first protrusion 110-1 and the second protrusions 120-1 may be in the bridge area BA. This configuration will be described later in detail. An imaginary alignment line AL which connects the first protrusion 110-1 with the second protrusion 120-1 may be defined. The imaginary alignment line AL is a line which connects a point on the outer circumference of the first protrusion 110-1 with a point on the outer circumference of the second protrusion 120-1, and the imaginary alignment line AL may be the same as a line which defines the shortest distance between the first protrusion 110-1 and the second projection 120-1. In an exemplary embodiment, the imaginary alignment line AL may be disposed on the bridge area BA. In such an embodiment, the imaginary alignment line AL may be disposed to cross the bridge area BA.

FIG. 2 illustrates a first distance d1 which is the shortest distance between the first protrusion 110-1 and the second protrusion 120-1. The first distance d1 may be a line of the shortest distance of a line which connects a point on the outer circumference of the first protrusion 110-1 with a point on the outer circumference of the second protrusion 120-1. As shown in FIGS. 2 and 6, a second distance d2 (see FIG. 6) may be defined as a distance between the first facing portion 110S of the source electrode 110 and the second facing portion 120S of the drain electrode 120 which are disposed between the source area SA and the drain area DA and face each other in an area other than the bridge area BA. The first distance d1 may be shorter than the second distance d2. In such an embodiment, the distance between the source electrode 110 and the drain electrode 120 in a portion in which the channel section Ch is formed may be shorter than the distance between the source electrode 110 and the drain electrode 120 in a remaining portion other than the portion in which the channel section Ch is formed.

The data wires 100, 110, 120, 130 may have a single film or multi-film structure including at least one material selected from nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se) and tantalum (Ta). In one exemplary embodiment, for example, the data wires 100, 110, 120, 130 may an alloy including at least one selected from the group consisting of titanium (Ti), zirconium (Zr), tungsten (w), tantalum (Ta), niobium (Nb), platinum (Pt), hafnium (Hf), oxygen (O) and nitrogen (N), but the materials of the data wires 100, 110, 120, 130 are not limited thereto.

In such an embodiment, where the first protrusion 110-1 and the second protrusions 120-1 face to each other, a thin film transistor may have high conductive characteristics by ensuring a proper channel length.

Hereinafter, an alternative embodiment of a liquid crystal display device according to the invention will be described. The same or like elements shown in FIGS. 7 to 9 have been labeled with the same reference characters as used above to describe the exemplary embodiments of the liquid crystal display device shown in FIGS. 1 to 6, and any repetitive detailed description thereof will hereinafter be omitted or simplified.

Figure 7:
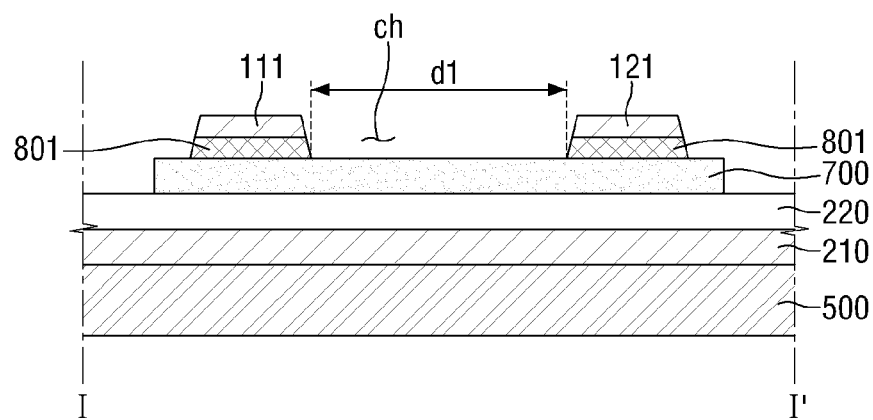
FIG. 7 is a partially cross-sectional view of the liquid crystal display device according to an alternative embodiment of the invention.

FIG. 7 is a cross-sectional view of a liquid crystal display device according to an alternative embodiment of the invention. In an alternative exemplary embodiment, as shown in FIG. 7, the source electrode 111, the drain electrode 121 and the ohmic contact layer 801 may have a tapered shape.

In such an embodiment, the ohmic contact layer 801 may overlap a source electrode 111 and/or a drain electrode 121. When the side walls of the source electrode 111 and the drain electrode 121 have a tapered shape, the side wall of the ohmic contact layer 801 may have a tapered shape. In such an embodiment, the side walls of the source electrode 111 and the drain electrode 121 may be aligned with the side wall of the ohmic contact layer 801. In such an embodiment, the outer walls of the source electrode 111 and the drain electrode 121 and the outer wall of the ohmic contact layer 801 may have the same inclination angle and may form a continuous slope.

In such an embodiment, the lower distal end of the ohmic contact layer 801 may be disposed on the relatively inner side than the outer wall of the semiconductor pattern layer 700. In one exemplary embodiment, for example, when the source/drain electrodes 111, 121 and the ohmic contact layer 801 are simultaneously or sequentially etched by the isotropic etching, and the semiconductor pattern layer 700 is anisotropically etched, the above-described structure may be formed, but the method of forming the structure is not limited thereto.

Figure 8:
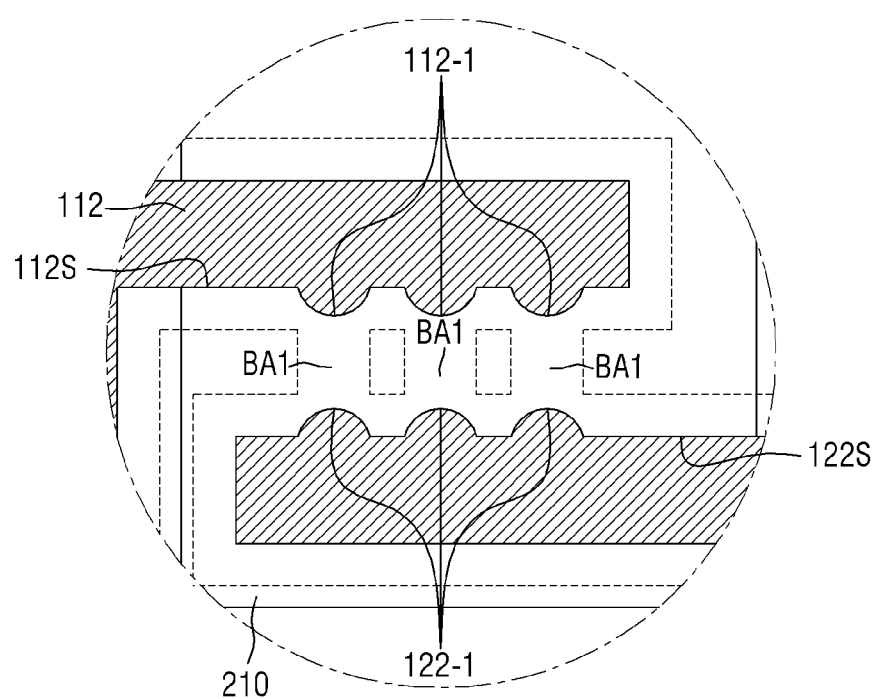
FIG. 8 is a plan view of the liquid crystal display device according to another alternative embodiment of the invention.

FIG. 8 is a plan view of the liquid crystal display device according to another alternative embodiment of the invention.

FIG. 8 illustrates an embodiment where a plurality of bridge areas BA1 is defined between the drain electrode DA and the source area SA.

Referring to FIG. 8, a plurality of bridge areas BA1 may be defined to be spaced apart from each other with a certain interval. In one exemplary embodiment, for example, the three bridge areas BA1 are defined between the drain electrode DA and the source area SA, as shown in FIG. 8, but the number of the bridge areas BA1 is not limited thereto. In an alternative exemplary embodiment, the number of bridge areas may be three or more, or less than three.

In one exemplary embodiment, as shown in FIG. 8, the bridge area BA1 may be disposed by being aligned in the first direction. Alternatively, the arrangement structure of the bridge area may be different depending on the shapes of the source electrode and the drain electrode.

In such an embodiment, where a plurality of bridge areas BA1 is defined, a plurality of first protrusions 112-1 may be provided to correspond thereto. In such an embodiment, where the plurality of bridge areas BA1, which is spaced apart from each other at a constant interval and aligned along the first direction, is defined, the plurality of the first protrusions 112-1 is spaced apart from each other at a constant interval to correspond to the bridge area BA1, may protrude from a first facing portion 112S, and may be aligned along the first direction.

In such an embodiment, where the plurality of bridge areas BA1 is defined, a plurality of second protrusions 122-1 may be provided to correspond thereto. In such an embodiment, where the plurality of bridge areas BA1, which is spaced apart from each other at a constant interval and aligned along the first direction, is defined, the plurality of the first protrusions 122-1 is spaced apart from each other at a regular interval to correspond to the bridge area BA1, may protrude from the second facing portion 122S and may be aligned along the first direction.

The plurality of first protrusions 112-1 and the plurality of the second protrusions 122-1 may face each other, respectively. In an exemplary embodiment, a first protrusion 112-1 and a second protrusion 122-1, which are corresponding to each other, may face each other, and the space between the first protrusion 112-1 and the second protrusion 121-1 may be disposed on each of the corresponding bridge areas BA1.

Figure 9:
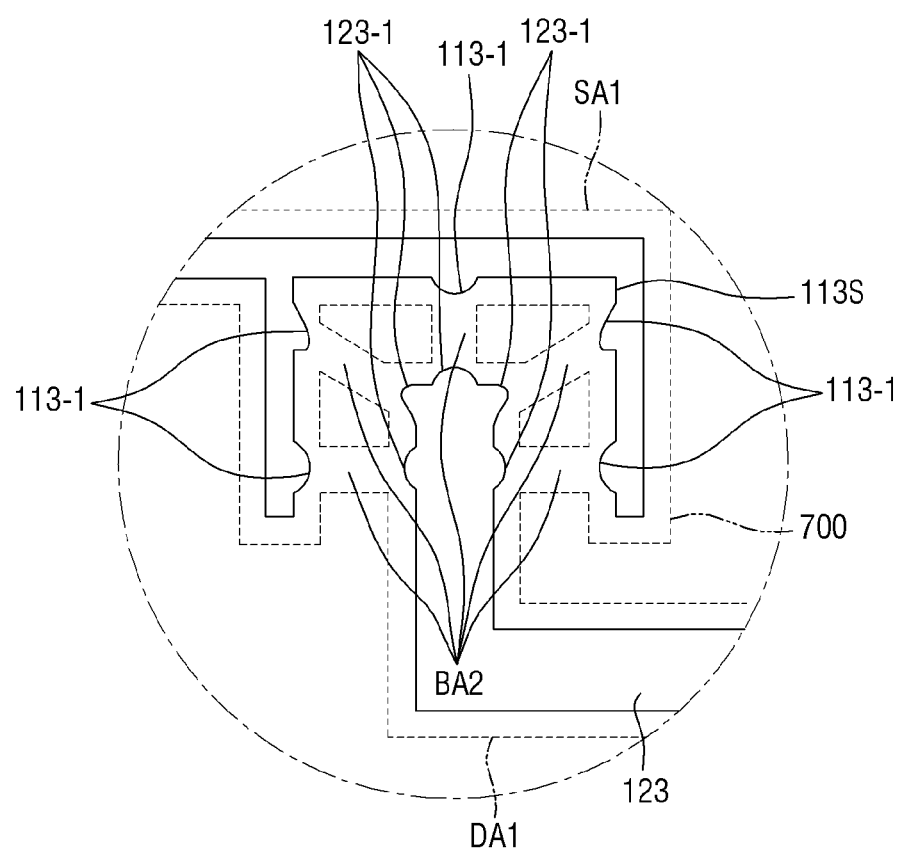
FIG. 9 is a plan view of a liquid crystal display device according to another alternative embodiment of the invention.

FIG. 9 is a plan view of a liquid crystal display device according to another alternative embodiment of the invention.

Referring to FIG. 9, an exemplary embodiment of the liquid crystal display device may include a U-shaped source electrode 113, and an I-shaped drain electrode shape 123 facing the U-shaped source electrode 113.

In such an embodiment, the source electrode 113 may have a U-shaped portion. In such an embodiment, the source electrode 113 may have a shape in which one side is open and the remaining three sides are closed. The drain electrode 123 is in an I-shape and may be partially inserted into the open one side of the source electrode 113. In such an embodiment, the liquid crystal display device may have a shape in which the U-shaped source electrode 113 surrounds the outside of the I-shaped drain electrode 123. In such an embodiment, the source electrode 113 and the drain electrode 123 are separated and spaced apart from each other rather than being in direct contact with each other.

In an exemplary embodiment in which the source electrode 113 has a U-shape and the drain electrode 123 has an I-shape, the source area SA1 and the drain area DA1 may have shapes corresponding to the shapes of the source electrode 113 and the drain electrode 123. In such an embodiment, the source area SA1 may haves a U-shape, and the drain area DA1 may have an I-shape, and the source electrode 113 may overlap the source area SA1, and the drain electrode 123 may overlap the drain area DA1.

In an exemplary embodiment in which the source area SA1 has a U-shape, and the drain area DA1 has an I-shape, the bridge area BA2 may be defined in a space defined by the U-shape. In such an embodiment, some of the drain area DA1 may be disposed in a space defined by the U-shape of the source area SA1, and the plurality of bridge areas BA2 may be disposed in the space between the source area SA1 and the drain area DA1. In an exemplary embodiment, one or more bridge areas BA2 may be defined.

The bridge area BA2 may extend in the first direction or the second direction, or may extend in a third direction which is inclined from the first direction and/or the second direction at a predetermined angle. In one exemplary embodiment, for example, where a plurality of bridge areas BA2 is defined, the bridge areas BA2 may include a bridge area extending in the first direction, a bridge area extending in the second direction, or a bridge area extending in the third direction. FIG. 9 shows one exemplary embodiment, where the two bridge areas extending in the first direction, one bridge area extending in the second direction, and the bridge areas extending in the third direction (a diagonal direction in FIG. 9), but the arrangement of the bridge areas BA2 is not limited thereto. Alternatively, the extending direction of the bridge areas BA2 may be in various combinations of the first direction, the second direction and the third direction.

In an exemplary embodiment, where the plurality of bridge areas BA2 is defined, a plurality of first protrusions 113-1 may be disposed to correspond thereto. In such an embodiment, the plurality of bridge areas BA2 is defined inside the space defined by the U-shaped source area SA1, and the first protrusion 113-1 may protrude toward the drain electrode 123 from the U-shaped first facing portion 113S. In such an embodiment, the plurality of first protrusions 113-1 may be provided, but it is not limited thereto. Alternatively, a single first protrusion 113-1 may be provided. In an exemplary embodiment, where the first protrusions 113-1 is disposed to correspond to the bridge areas BA2, the number of the bridge areas BA2 may be the same as the number of the first protrusions of 113-1. However, it is not limited thereto, and alternatively, the number of the first protrusions 113-1 may be larger or smaller than the number of the bridge areas BA2.

In such an embodiment, the second protrusions 123-1 may be disposed to correspond to the first protrusions 113-1. The second protrusions 123-1 may protrude from the second facing portion 123S as described above. In an exemplary embodiment, where the plurality of first protrusions 113-1 is disposed, a plurality of second protrusions 123-1 may be disposed to correspond to the first protrusions 113-1, and f the number of the first protrusions 113-1 may be the same as the number of the second protrusions 123-1. However, it is not limited thereto, and alternatively, the number of second protrusions 123-1 may also be larger or smaller than the number of first protrusions 113-1.

The first protrusions 113-1 may protrude in the first direction, the second direction or the third direction, and the second protrusion 123-1 facing the first protrusions 113-1 may thereby protrude in the first direction, the second direction or the third direction. In one exemplary embodiment, for example, the first protrusion protruding in the first direction may face the second protrusion protruding in the first direction.

Hereinafter, an embodiment of a method of manufacturing the liquid crystal display device, according to the invention, will be described. Some of the configuration described below is the same as the configuration of the embodiments of the liquid crystal display device described above, and any repetitive detailed thereof may be omitted for convenience of description.

Figure 10:
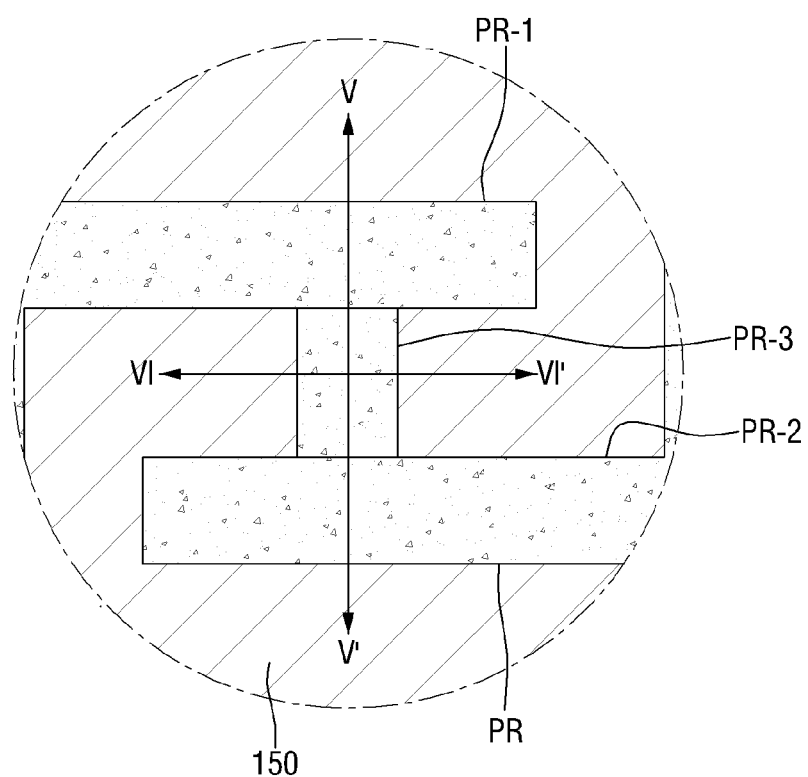
FIG. 10 is a plan view showing an embodiment of a method of manufacturing the liquid crystal display device, according to the invention.

FIG. 10 is a plan view showing an embodiment of a method of manufacturing the liquid crystal display device, according to the invention. FIGS. 11 to 14 are cross-sectional views showing an embodiment of the method of manufacturing the liquid crystal display device, according to the invention. FIGS. 11 to 14 are views corresponding to a cross-sectional view taken along line V-V' and a cross-sectional view taken along line VI-VI' of FIG. 10.

An embodiment of the method of manufacturing the liquid crystal display includes preparing a substrate on which the first conductive film 250, the gate insulating film 220, the semiconductor layer 750, the ohmic contact layer 800 and the second conductive film 150 are sequentially provided, e.g., laminated; providing (e.g., forming) a photosensitive film pattern PR on the substrate, where the photosensitive film pattern PR includes a first area PR-1, a second area PR-2 facing the first area PR-1, and a third area PR-3 connecting the first area PR-1 with the second area PR-2; providing (e.g., forming) a source electrode 110 below the first area PR-1, a drain electrode 120 below the second area PR-2, and a channel section Ch below the third area PR-3, by etching the second conductive film 150 and the ohmic contact layer 800 using the photosensitive film pattern PR as an etching mask; and forming a semiconductor pattern layer 700 by etching the semiconductor layer 750 using the photosensitive film pattern PR as an etching mask, where the semiconductor pattern layer 700 includes a source area SA disposed below the first area PR-1 and overlapping the source electrode 110, a drain area DA disposed below the second area PR and overlapping the drain electrode 120, and a bridge area BA disposed below the third area PR-3 and connecting the source area SA and a drain area DA.

Figure 11:
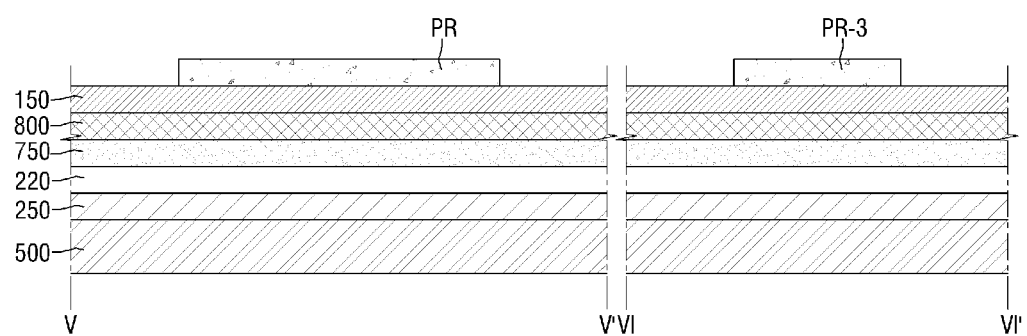
FIGS. 11 to 14 are cross-sectional views showing an embodiment of the method of manufacturing the liquid crystal display device, according to the invention.

First, referring first to FIGS. 10 and 11, the first conductive film 250 is provided or formed on the substrate 500. The first conductive film 250 may include or be formed of a gate wiring conductor. The first conductive film 250 may be formed by methods, such as a chemical vapor deposition, a plasma chemical vapor deposition, a physical vapor deposition and sputtering, for example.

Next, a gate insulating film 220 is provided or formed on the first conductive film 250. The gate insulating film 220 may be formed by a method such as the chemical vapor deposition.

Next, the semiconductor layer 750 and the ohmic contact layer 800 are provided or formed on the gate insulating layer 220. Each of the semiconductor layer 750 and the ohmic contact layer 800 may be sequentially formed by a method such as the chemical vapor deposition, for example. The semiconductor layer 750 and the ohmic contact layer 800 may share a source gas. Therefore, the semiconductor layer 750 and the ohmic contact layer 800 may be formed in-situ.

In an exemplary embodiment, the first conductive film 250 may be etched to form a gate electrode 210 of the liquid crystal display device. In such an embodiment, the first conductive film 250 may include or be formed of substantially the same material as the above-mentioned gate electrode 210.

Subsequently, the gate insulating film 220 may be provided or formed on the first conductive film 250. The gate insulating film 220 may be provided to cover the gate electrode 210 and the substrate 500.

The semiconductor layer 750 may be provided or formed on the gate insulating film 220. In an exemplary embodiment, the semiconductor layer 750 may be etched to form the semiconductor pattern layer 700 of the liquid crystal display device. In such an embodiment, the semiconductor layer 750 may include or be formed of substantially the same material as the semiconductor pattern layer 700.

The ohmic contact layer 800 may be provided or formed on the semiconductor layer 750, and the second conductive film 150 may be provided or formed on the ohmic contact layer 800. In an exemplary embodiment, the second conductive film 150 may be etched to form the data wires 100, 110, 120, 130. In an exemplary embodiment, the second conductive film 150 may include or be formed of substantially the same material as the data wires 100, 110, 120, 130.

The photosensitive film pattern PR including the first area PR-1, the second area PR-2, and the third area PR-3 may be provided or formed on the second conductive film 150. In such an embodiment, the first area PR-1 may extend in the first direction. The second area PR-2 may be spaced apart from the first area PR-1 and disposed parallel to the first area PR-1. In such an embodiment, the first area PR-1 and the second area PR-2 may face each other. The third area PR-3 may be disposed between the first area PR-1 and the second area PR-2 and may connect the first area PR-1 and the second area PR-2.

In one exemplary embodiment, for example, the first area PR-1 is disposed parallel to the second area PR-2, and the third area PR-3 may extend in the second direction to connect the first area PR-1 with the second area PR-2, but the structure of the third area PR-3 is not limited thereto.

The thicknesses of the first area PR-1, the second area PR-2 and the third area PR-3 may be substantially the same as each other. Here, the thickness may mean a difference in distance between the upper and lower surfaces when viewed in the cross-section of FIGS. 11 to 14.

Figure 12:
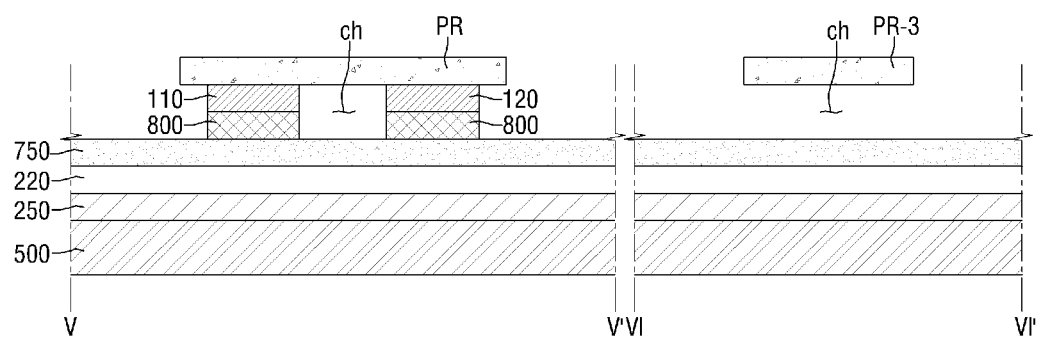
Figure 13:
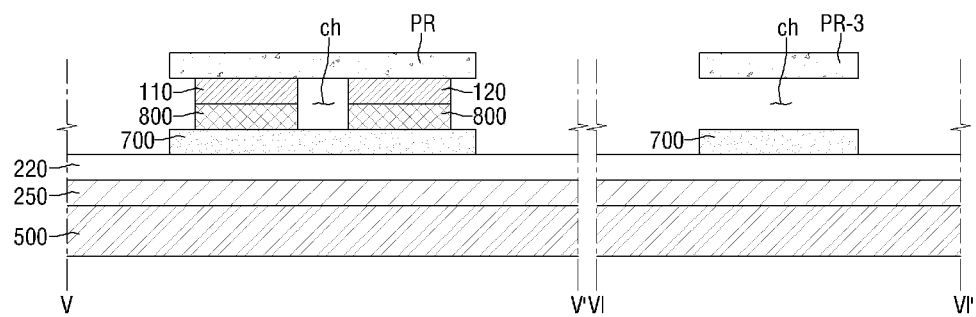
Figure 14:
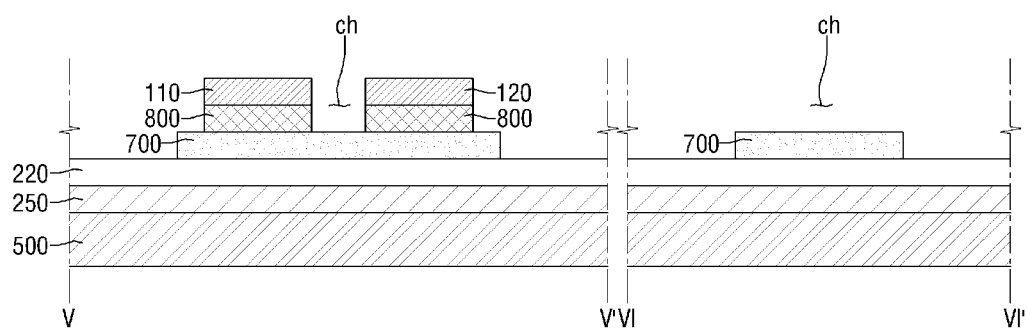

Subsequently, referring to FIG. 12, the second conductive film 150 and the ohmic contact layer 800 may be etched using the photosensitive film pattern PR as an etching mask. In one exemplary embodiment, for example, the second conductive film 150 and the ohmic contact layer 800 may be simultaneously or sequentially etched by the same etchant, but not being limited thereto. Alternatively, the second conductive film 150 and the ohmic contact layer 800 may be etched by the different etchants from each other.

In an exemplary embodiment, the second conductive film 150 and the ohmic contact layer 800 may be isotropically etched. In such an embodiment, when the second conductive film 150 and the ohmic contact layer 800 are etched, the source electrode 110, the drain electrode 120 and the channel section Ch may be formed. The ohmic contact layer 800 may be formed to overlap the source electrode 110 and the drain electrode 120. As described above with reference to FIGS. 5 and 7, the side walls of the ohmic contact layer 800, and the side walls of the source electrode 110 and the drain electrode 120 may be aligned with each other.

The process of forming the source electrode 110, the drain electrode 120 and the channel section Ch will hereinafter be described in greater detail. When the second conductive film 150 is isotropically etched, the outer walls of the source electrode 110 and the drain electrode 120 may be formed on the inside of the extension of the outer wall of photosensitive film pattern PR by a skew phenomenon due to the isotropic etching. In such an embodiment, the side etching may progress toward the inside from the extension of the outer wall of the photosensitive film pattern PR by the isotropic etching. In such an embodiment, when the width of the third area PR-3 is sufficiently small, that is to say, when the width of the third area PR-3 is significantly smaller than the first area PR-1 and the second area PR-2, the second conductive film 150 disposed below the third area PR-3 is penetrated by the side etching performed on one side of the third area PR-3 and the side etching performed on the other side, and thus, a tunnel may be formed. Such a tunnel may be disposed between the source electrode 110 and the drain electrode 120 to form the channel section Ch, which will be described again with reference to FIGS. 3 and 4. The isotropic etching progresses on the outside of the drain electrode 120, and the side etching of the third width w3 and the fourth width w4 may progress. In such an embodiment, the sides etching of the same degree as described above may also occur below the third area PR-3, and when the width of the third area PR-3 is smaller than the sum of the third width w4 and the fourth width w4, the second conductive film 150 below the third area PR-3 may be penetrated to form the channel section Ch.

In such an embodiment, the process of forming the source electrode 110 below the first area PR-1, the drain electrode 120 below the second area PR-2, and the channel section Ch below the third area PR-3 by etching the second conductive film 150 and the ohmic contact layer 800 using the photosensitive film pattern PR as an etching mask may include forming a first protrusion 110-1 which protrudes toward the drain electrode 120 from the first facing portion 110S, and forming a second protrusion 120-1 which protrudes toward the first protrusion 110-1 from the second facing portion 120S and faces the first protrusion 110-1.

In such an embodiment, the first protrusion 110-1 may be formed below a portion (a portion which forms a "T" shape in FIG. 10) which connects the first area PR-1 with the third area PR-3. As described above, when the second conductive film 150 is isotropically etched, the side etching may progress. The side etching in the portion in which the first area PR-1 is connected to the third area PR-3 may be inferior to the side etching in the remaining portions except the portion in which the first area PR-1 is connected to the third area PR-3. Accordingly, the side etching may simultaneously progress on one side and the other side of the first area PR-1, the side etching at a point of being in contact with the third area PR-3 may be weaker than other portions due to the presence of the third area PR-3, and thus, the first protrusion 110-1 protruding in the extending direction of the third area PR-3 may be formed below the third area PR-3.

The second protrusion 120-1 may also be formed in substantially the same way as the first area PR-1. The second protrusion 120-1 may be formed below a portion (a portion which forms a "T" shape in FIG. 10) in which the second area PR-2 is connected to the third area PR-3. As described above, when the second conductive film 150 is isotropically etched, the side etching may progress. The side etching in the portion in which the second area PR-2 is connected to the third area PR-3 may be inferior to the side etching in the remaining portions except the portion in which the second area PR-2 is connected to the third area PR-3. Accordingly, the side etching may simultaneously progress on one side and the other side of the second area PR-2, the side etching at a point of being in contact with the third area PR-3 may be weaker than other portions due to the presence of the third area PR-3, and thus, the second protrusion 120-1 protruding in the extending direction of the third area PR-3 may be formed below the third area PR-3. In such an embodiment, the first protrusion 110-1 and the second protrusions 120-1 may be formed to face each other while being spaced apart from each other below the third area PR-3.

Subsequently, etching the semiconductor layer 750 using the photosensitive film pattern PR as an etching mask may be performed, while the photosensitive film pattern PR is maintained without being changed. The semiconductor layer 750 may be anisotropically etched. Etching of the semiconductor layer 750 may be performed by a dry etching method, but it is not limited thereto. When the semiconductor layer 750 is etched, it is disposed below the first area PR-1 and is disposed below the source area SA and the second area PR-2 overlapping the source electrode 110 and is disposed below the drain area DA and the third area PR-3 overlapping the drain electrode 120, and the semiconductor pattern layer 700 including the bridge area BA which connects the source area SA with the drain area DA may be formed. The source area SA, the drain area DA and the bridge area BA may be substantially the same as those in the exemplary embodiments of the liquid crystal display device described above, and any repetitive detailed description thereof will be omitted.

When performing the anisotropic etching, the side etching may be inferior to the isotropic etching. Accordingly, when performing the anisotropic etching, the outside of the semiconductor pattern layer 700 may be aligned with the extension of the outer wall of photosensitive film pattern PR. In such an embodiment, even when the side etching is performed, the outer wall of the semiconductor pattern layer 700 may be disposed on the relatively outer side than the outer walls of the source electrode 110, the drain electrode 120 and the ohmic contact layer 800.

Although it is not illustrated in the drawings, a passivation film which partially exposes the drain electrode 120 may be disposed on the data wires 100, 110, 120, 130. The drain electrode 120 exposed by the passivation film may be electrically connected to a pixel electrodes (not illustrated) disposed on the passivation film. In such an embodiment, the liquid crystal display device may further include an upper insulating substrate (not illustrated) which faces the substrate. A common electrode (not illustrated), a black matrix (not illustrated), a color filter (not illustrated) or the like may be further provided on the upper insulating substrate. In such an embodiment, the liquid crystal display device may be in a vertical alignment ("VA") mode, the scope of the invention is not limited thereto. In an exemplary embodiment, the color filter and the black matrix may be disposed on the upper substrate, but in an alternative exemplary embodiment, the color filter and/or the black matrix may be disposed on the substrate 500. In an exemplary embodiment, the liquid crystal display device may be in a color filter-on-array ("COA") mode, or a black matrix-on-Array ("BOA") mode.

In such an embodiment, the common electrode may be disposed on the upper insulating substrate, but not being limited thereto. Alternatively, the common electrode may be disposed on the substrate 500. In such an embodiment, the liquid crystal display device may be in a plane-to-line switching ("PLS") mode.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A liquid crystal display device comprising:
   a substrate;
   a gate line disposed on the substrate and extending in a first direction;
   a data line extending across the gate line in a second direction crossing the first direction;
   a gate electrode extending from the gate line in the second direction;
   a semiconductor pattern layer disposed on the gate electrode;
   a source electrode extending from the data line in the first direction and disposed on the semiconductor pattern layer;
   a drain electrode disposed on the semiconductor pattern layer, spaced apart from the source electrode in the second direction and facing the source electrode in the second direction; and
   a pixel electrode connected to the drain electrode;
   wherein the source electrode comprises:
      a first facing portion which faces the drain electrode in the second direction; and
      a first protrusion which protrudes toward the drain electrode from the first facing portion in the second direction,
   wherein the drain electrode comprises:
      a second facing portion which faces the source electrode in the second direction; and
      a second protrusion which protrudes toward the source electrode from the second facing portion in the second direction and faces the first protrusion in the second direction, and
   wherein the semiconductor pattern layer comprises:
      a source area overlapping the source electrode;
      a drain area overlapping the drain electrode; and
      a bridge area which connects the source area with the drain area, and
   wherein a space defined between the first protrusion and the second protrusion in the second direction is disposed on the bridge area, and
   wherein a shortest distance between the first protrusion of the source electrode and the second protrusion of the drain electrode measured in the second direction in a portion in which a channel section is formed is less than a shortest distance between the first facing portion of the source electrode and the second facing portion of the drain electrode measured in the second direction in a remaining portion other than the portion in which the channel section is formed.

2. The liquid crystal display device of claim 1, wherein outer walls of the source electrode and the drain electrode are disposed on an inner side than an outer wall of the semiconductor pattern layer.

3. The liquid crystal display device of claim 1, wherein a lateral width of the bridge area is smaller than a value obtained by subtracting a vertical width of the drain electrode from a vertical width of the drain area.

4. The liquid crystal display device of claim 1, further comprising:
   a channel section defined in the space between the first protrusion and the second protrusion.

5. The liquid crystal display device of claim 4, wherein a distance between a portion of the source electrode and a portion of the drain electrode, between which the channel section is defined, is smaller than a distance between a portion of the source electrode and a portion of the drain electrode, between which the channel section is not defined.

6. The liquid crystal display device of claim 1, further comprising:
   an ohmic contact layer which overlaps the source electrode and the drain electrode.

7. The liquid crystal display device of claim 6, wherein outer walls of the source electrode and the drain electrode are aligned with an outer wall of the ohmic contact layer.

8. The liquid crystal display device of claim 7, wherein a lower distal end of the ohmic contact layer is disposed on an inner side than an outer wall of the semiconductor pattern layer.

9. The liquid crystal display device of claim 1, wherein the source electrode and the drain electrode have a tapered shape.

10. The liquid crystal display device of claim 1, wherein a plurality of bridge areas is defined.

11. The liquid crystal display device of claim 10, wherein the space between the first protrusion and the second protrusion is disposed on each of the bridge areas.

12. The liquid crystal display device of claim 10, wherein the bridge areas are spaced apart from each other with a predetermined interval and aligned along a first direction.

13. The liquid crystal display device of claim 1, wherein the source electrode comprises a U-shaped portion, and the drain electrode comprises an I-shaped portion.

14. The liquid crystal display device of claim 13, wherein the bridge area is disposed in a space defined by the U-shaped portion of the source electrode, and extends in at least one of a first direction, a second direction orthogonal to the first direction, and a third direction inclined from the first direction at a predetermined angle.

15. A method of manufacturing a liquid crystal display device, the method comprising:
   preparing a substrate on which a first conductive film, a gate insulating film, a semiconductor layer, an ohmic contact layer and a second conductive film are sequentially provided one on another;
   providing a photosensitive film pattern on the substrate, wherein the photosensitive film pattern comprises a first area, a second area facing the first area, and a third area connecting the first area with the second area;

providing a source electrode below the first area, a drain electrode below the second area, and a channel section below the third area, by etching the second conductive film and the ohmic contact layer using the photosensitive film pattern as an etching mask; and providing a semiconductor pattern layer by etching the semiconductor layer using the photosensitive film pattern as an etching mask, wherein the semiconductor pattern layer comprises a source area overlapping the source electrode below the first area, a drain area overlapping the drain electrode below the second area, and a bridge area connecting the source area and the drain area below the third area.

16. The method of claim 15, wherein the source electrode comprises a first facing portion facing the drain electrode, and the drain electrode comprises a second facing portion facing the source electrode, and the providing the source electrode below the first area, the drain electrode below the second area, and the channel section below the third area using the photosensitive film pattern as the etching mask comprises:

providing a first protrusion which protrudes toward the drain electrode from the first facing portion; and providing a second protrusion which protrudes from the second facing portion and faces the first protrusion.

17. The method of claim 15, wherein a lateral width of the third area is smaller than a value obtained by subtracting a vertical width of the drain electrode from a vertical width of the drain area.

18. The method of claim 15, wherein thicknesses of the first area, the second area and the third area are the same as one another.

19. The method of claim 15, wherein the providing the source electrode below the first area, the drain electrode below the second area, and the channel section below the third area, by etching the second conductive film and the ohmic contact layer using the photosensitive film pattern as the etching mask comprises isotropically etching the second conductive film.

20. The method of claim 15, wherein the providing the semiconductor pattern layer comprising the source area overlapping the source electrode below the first area, the drain area overlapping the drain electrode below the second area, and the bridge area connecting the source area and the drain area below the third area, by etching the semiconductor layer using the photosensitive film pattern as the etching mask comprises anisotropically etching the semiconductor layer.

* * * * *